United States Patent [19]

Tsurumi

[11] Patent Number: 5,615,218
[45] Date of Patent: Mar. 25, 1997

[54] TEST PATTERN GENERATION DEVICE FOR SEMICONDUCTOR TESTING APPARATUS

[75] Inventor: Yoshimitsu Tsurumi, Tokyo, Japan

[73] Assignee: Ando Electric Co., Ltd., Tokyo, Japan

[21] Appl. No.: 545,313

[22] Filed: Oct. 19, 1995

[30] Foreign Application Priority Data

Oct. 31, 1994 [JP] Japan .................................. 6-267850

[51] Int. Cl.$^6$ .......................... G06F 11/00; G11C 29/00
[52] U.S. Cl. ............................................ 371/27; 371/21.1
[58] Field of Search ........................ 371/27, 21.1, 22.1, 371/22.5, 22.6

[56] References Cited

U.S. PATENT DOCUMENTS

| | | | |
|---|---|---|---|
| 4,293,950 | 10/1981 | Shimizu et al. | 371/27 |
| 5,337,045 | 8/1994 | Shirasaka | 371/27 |
| 5,473,616 | 12/1995 | Tsutsui et al. | 371/21.1 |

Primary Examiner—Robert W. Beausoliel, Jr.
Assistant Examiner—Trinh L. Tu
Attorney, Agent, or Firm—Finnegan, Henderson, Farabow, Garrett & Dunner, L.L.P.

[57] ABSTRACT

A test pattern generation device for testing semi-conductor devices is presented. The device generates high capacity patterns much more quickly than is possible with the conventional test pattern generator while permitting the use of the conventional layout of the test patterns and the common operational features of the existing test pattern generators. The control circuit stores an index address in the address pointer. Upon receiving a transfer command, the index is outputted to the execution memory, and the leading address data thus read out is stored in the modifier register. Next, the address generator is activated, and the address data and the output of the modifier register are added by the adder. The added result is inputted into the execution memory via the selector. This process is repeated successively for other leading address data, and the test patterns are thus outputted from the execution memory without the use of a buffer memory used in the conventional types of test pattern generators.

3 Claims, 5 Drawing Sheets

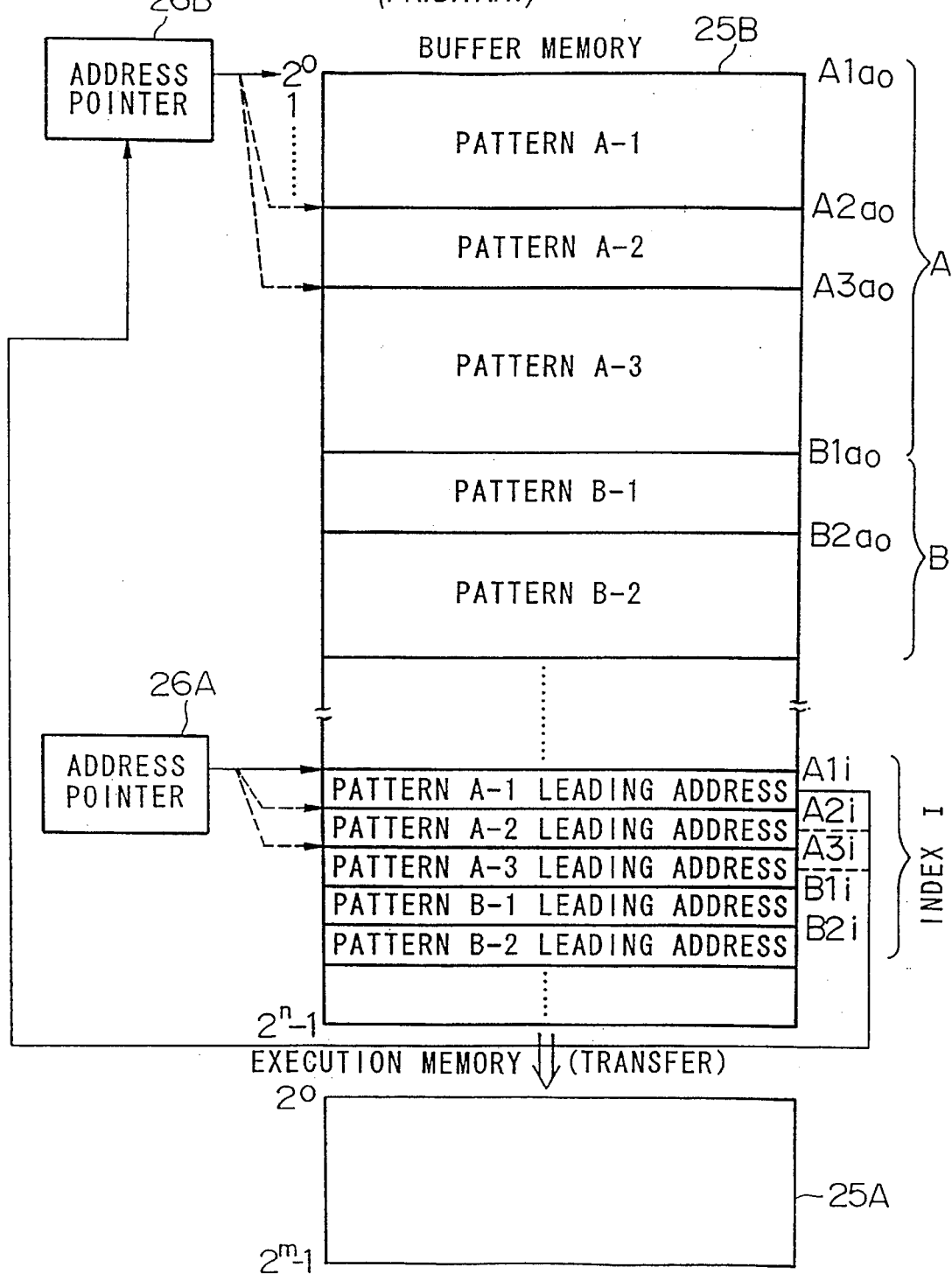

5,615,218

TEST PATTERN GENERATION DEVICE FOR SEMICONDUCTOR TESTING APPARATUS

BACKGROUND OF THE INVENTION

1. Field of the Invention

The present Invention relates in general to a pattern generation device for semiconductor testing apparatus, and relates in particular to a test pattern generator device for generating high capacity patterns quickly.

2. Description of the Related Art

FIG. 3 shows a device configuration of a test pattern generator device for semiconductor testing apparatus according to the conventional technology. The device comprises: an address generator 21A; modifier register 22A; an adder 23A; a control circuit 24A; and an execution memory 25A having m-bit address space (where m is an integer).

When a test pattern is a small capacity pattern which can be accessed with an m-bit length address, the execution memory 25A is capable of storing several length of patterns, as in an example shown in FIG. 4. The data for the patterns are transferred from a magnetic disc device or other similar data storage device (not shown) to the execution memory 25A.

The test pattern generation operation of the conventional device shown in FIG. 3 will be explained in the following. First, under the action of the control circuit 24A, the leading address Ca0 of a pattern C (refer to FIG. 4) is stored in the modifier register 22A. Similarly, under the action of the control circuit 24A, the address generator 21A outputs successive addresses $0~(2^m-1)$. The m-bit address outputted by the address generator 21A and the m-bit data of the modifier register 22A are added by the adder 23A, and the resulting added addresses are outputted to the execution memory 25A. When the process is completed, the execution memory 25A outputs the test pattern C.

Similarly, when a test pattern D is to be outputted, the leading address Da0 is stored in the modifier register 22A, and when a test pattern E is to be outputted, the leading address Ea0 is stored in the modifier register 22A. Subsequently, following the similar steps as outlined above, pattern D or pattern E is outputted from the execution memory 25A.

With increasing-length of the test patterns, a need has arisen for enlarging the memory capacity in the semiconductor testing apparatus. However, fast and high capacity memories are very expensive, and enlarging the memory capacity of the execution memory device 25A, such as the one shown in FIG. 3, would result in a significant cost increase for the testing apparatus. For this reason, this problem has conventionally been dealt with by installing a high capacity but slow-speed buffer memory 25B such as the one shown in FIG. 5. The device configuration of this buffer memory will be explained in the following.

The pattern generator shown in FIG. 5 has additional components added to the test pattern generator shown in FIG. 3, i.e., a buffer memory 25B; address pointers 26A, 26B; and a selector 27A. The buffer memory 25B, the address pointers 26A, 26B and the selector 27A all generate output data of an n-bit length (where n is an integer and n>m). The buffer memory 25B stores those patterns which are accessible with an address having less than n-bits.

FIG. 6 shows an example of a memory map for the buffer memory 25B, for the patterns A, B which are transferred by and stored in a magnetic disc (not shown). In this case, although the buffer memory 25B has an n-bit capability, the execution memory 25A has a shorter m-bit capability, and therefore, it is necessary that the patterns A, B be divided into groups of a size of less than m-bits that can be stored in the execution memory 25A. The pattern A is divided into groups of A-1, A-2 and A-3; and the pattern B is divided into groups of B-1, B-2, for example. The leading address data of these groups are stored as index I in other areas of the buffer memory 25B.

The operation of the buffer memory 25B is controlled by the control circuit 24A as follows. The control circuit commands so that address A1$i$ which stores the leading address data of the pattern A-1 is inputted into the address pointer 26A. The control circuit 24A then issues a transfer command so that the selector 27A is switched to select the output of the address pointer 26A, and the leading address data of the pattern A-1 is read out from the buffer memory 25B and is stored in the address pointer 26B. Next, the selector 27A is switched to the output of the address pointer 26B. In this way, the pattern A-1 is successively forwarded to the execution memory 25A.

At this time, because the pattern A-1 is stored starting from the address location $2^0$ (=0) in the execution memory 25A, a [0] is stored in the modifier register 22. When the A-1 transfer process is completed, the leading address data A2$i$ of the next pattern A-2 is stored in the address pointer 26A.

Next, the control circuit 24A commands the address generator 21A to generate successive addresses $0~(2^m-1)$. These m-bit addresses are supplied to the address in the execution memory 25A through the adder 23A so as to output the pattern A-1. This transfer command process is repeated to output the successive patterns A-2, A-3.

As summarized above, to generate large capacity patterns using the conventional pattern generator having a buffer memory and an execution memory, it is necessary to repeatedly perform tile pattern transfer process. This process is time-consuming and results in a lengthy testing time. It is also necessary to be aware of the capacity of the execution memory 25A in dividing the patterns into groups of suitable size as well as where to insert the transfer command so that the pattern generation process can be performed smoothly.

In recent years, there have been significant improvements achieved in mass production of high capacity semiconductor memories, and have resulted in lowering of the cost of fast high capacity memories. Therefore, there appear to be no obstacles to increasing the capacity of the execution memory, and it should be possible to generate high capacity patterns with a fast pattern generator device having a large capacity execution memory instead of a buffer memory.

SUMMARY OF THE INVENTION

It is an object of tile present invention to provide a test pattern generation device, for a semiconductor testing apparatus, having a high capacity execution memory instead of a buffer memory, so as to generate high capacity test patterns quickly while also retaining the adaptability of conventional divided test patterns to the device.

The object is achieved in a test pattern generation device, for generating test patterns for a semiconductor testing apparatus, comprising: a control section for controlling operating steps of the apparatus; an execution memory for storing a plurality of test pattern data and corresponding indexes for indicating memory locations of the test pattern data; an address generator for generating addresses; a modifier register for outputting one of the indexes; an adder for adding output data of the address generator and output data of the modifier register; an address pointer for indicating memory locations of the indexes in the execution memory; and a selector for selecting one output data from the adder or the address pointer.

According to the device configuration of the present invention, indexes of the test patterns are read out successively from the execution memory according to the output data of the address pointer and are inputted into the modifier register. The indexes so obtained and the output of the address generator are added in the adder, and are outputted to the execution memory through the selector. A test pattern defined by the corresponding index is thus outputted from the execution memory. By renewing the index inputted into the modifier register, any test pattern can be successively outputted directly from a permanent storage device such as a magnetic disc without performing an actual process of transferring the test pattern.

The test pattern generation device can generate sized-groups of test patterns without performing actual transfer process of the test pattern into a temporary holding memory, but through a pseudo-transfer process regulated by renewing the data in the modifier register. Therefore, high capacity test patterns can be generated quickly while maintaining the conventional arrangement of the divided test patterns so as to provide universal applicability of the present device to conventionally prepared test patterns. The device can also process undivided test patterns, and therefore, the design process for test patterns can be simplified significantly, and the testing process is made much more cost effective than with the conventional test pattern generators.

BRIEF DESCRIPTION OF THE DRAWINGS

FIG. 6 is a block diagram showing the relationship between the buffer memory 251t and the address pointers 26A, 26B of the pattern generator shown in FIG. 5.

DESCRIPTION OF THE PREFERRED EMBODIMENTS

An embodiment of the present invention of the pattern generator device will be explained in the following with reference to the drawings.

Figure 1:
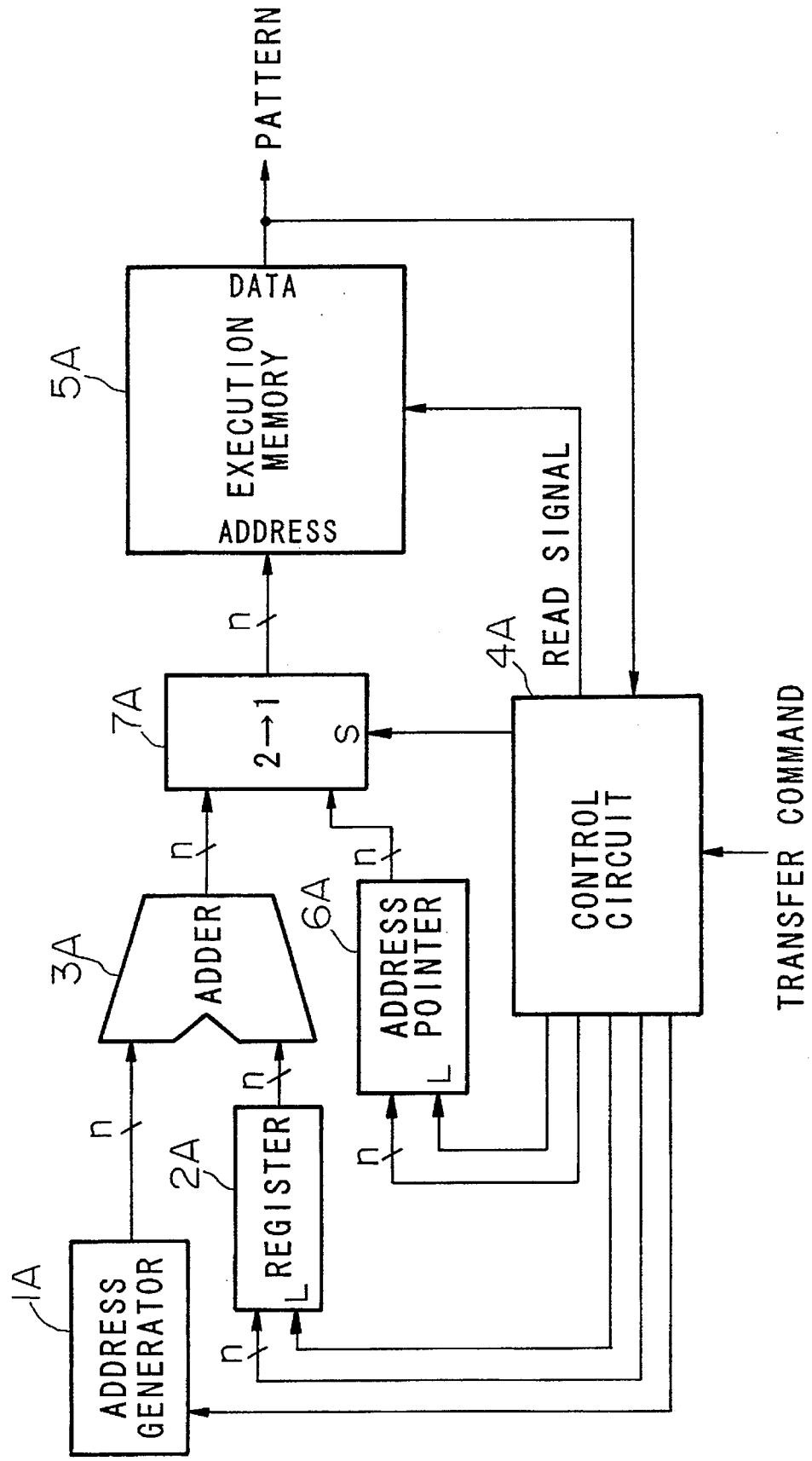
FIG. 1 is a block diagram of the pattern generator device of the present invention.

FIG. 1 is a block diagram of the pattern generator device comprising: an address generator 1A; a modifier register 2A; an adder 3A; a control circuit 4A; an execution memory 5A; an address pointer 6A; and a selector 7A.

Figure 2:
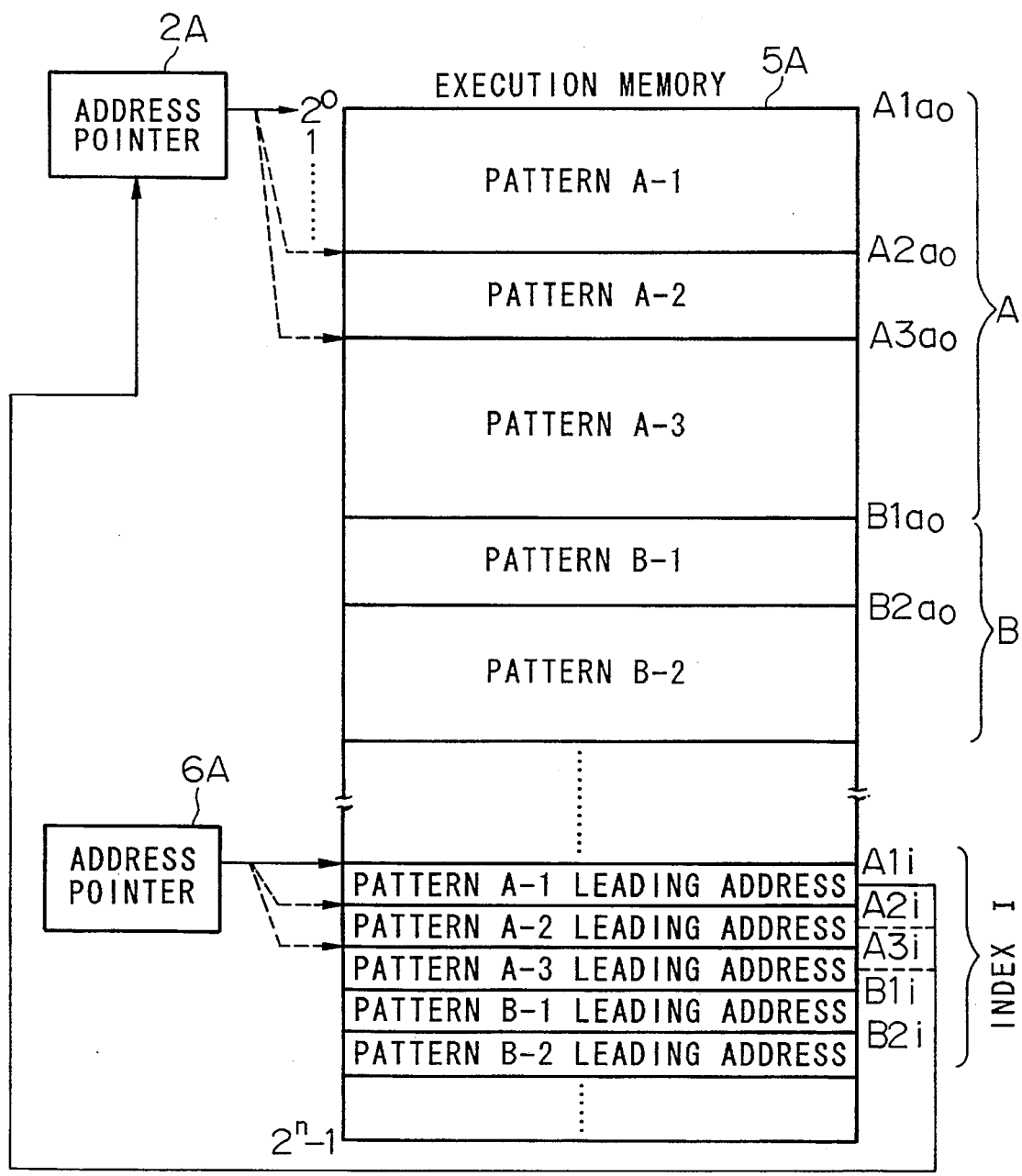
FIG. 2 is a schematic illustration of the memory contents in the execution memory 5A and the address pointers 2A, 6A.
Figure 3:
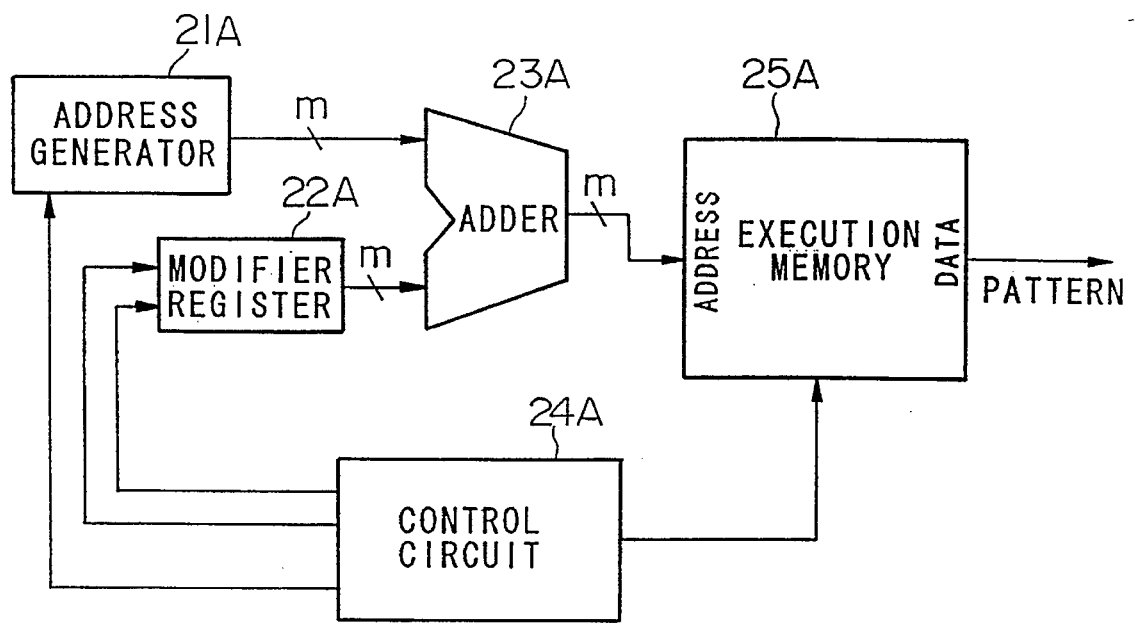
FIG. 3 is a block diagram of a conventional pattern generator device.
Figure 4:
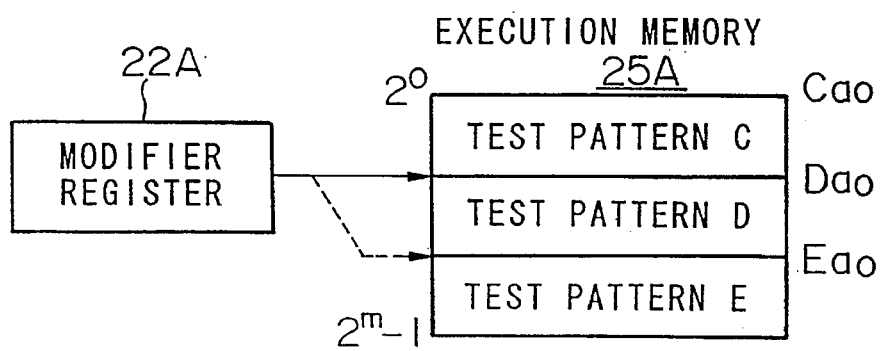
FIG. 4 is an illustration showing the relationship between the memory configuration of the execution memory 25A shown in FIG. 3 and the modifier register 22A.
Figure 5:
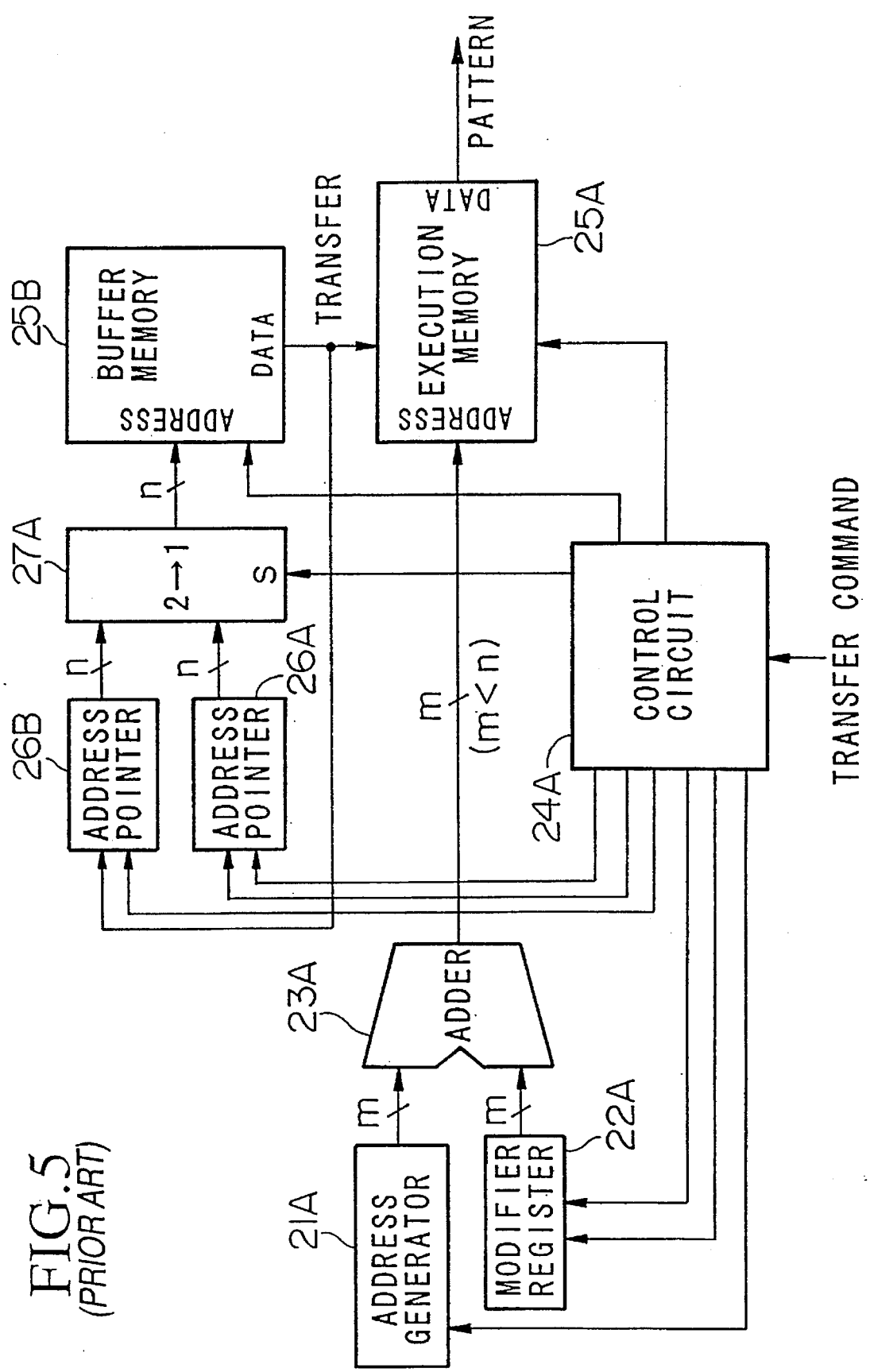
FIG. 5 is a block diagram of a pattern generator device according to the conventional technology based on a buffer memory 25B.

The execution memory 5A is accessible by an address signal of an n-bit length. Various test patterns and their indexes, such as those illustrated in FIG. 2, are stored in a magnetic disc or other such device (not shown), and are transferred to the execution memory 5A upon commands. In FIG. 2, pattern A is divided into groups A-1, A-2 and A-3 having an address size of less than m-bit length (where m is an integer and n>m), and similarly, pattern B is divided into groups B-1 and B-2. The leading addresses for the divided groups of patterns are stored in the index I.

The operation of the test pattern generation device having the device configuration presented above will be explained in the following.

First, under the action of the control circuit 4A, an addresser A1$i$ storing the leading address data A1$a$0 of the pattern A-1 is inputted in the address pointer 6A. Upon receiving a transfer command, the control circuit 4A switches the selector 7A so as to select the output of the address pointer 8A and outputs a read signal to the execution memory 5A. The leading address data A1$a$0 of the pattern A-1 thus obtained is stored in the modifier register 2A, after which, the leading address A2$i$ showing the memory location of the leading address data of the next pattern A-2 is inputted in the address pointer 6A.

Next, the control circuit 4A commands the selector 7A to select the output of the adder 3A, and activates the address generator 1A. The result is a generation of a series of output addresses $0^-(2^n-1)$ from the address generator 1A. In this case, however, because the test patterns are divided into groups having an address size of less than m-bit length, the series of output address are $0^-(2^m-1)$.

The control circuit 4A then switches the selector 7A so as to select the output of the adder 3A, and activates the address generator 1A. In this case, however, because the test pattern is divided into groups of less than m-bit length, the series of output address are $0^-(2^m-1)$. The n-bit address data are added to an n-bit address data A1$a$0 outputted from the modifier register 2A in the adder 3A, and are supplied to the addresses of the execution memory 5A via the selector 7A. A read-signal is outputted from the control circuit 4A, and successive sub-patterns of the test pattern A-1 are outputted from the execution memory 5A.

When another transfer command is issued, the leading address data A2$a$0 of the test pattern A-2 is stored in the modifier register 2A, and similar steps are repeated to output the test pattern A-2. Thus, when the data in the modifier register 2A are renewed successively as A3$a$0 B1$a$0 B2$a$0 . . . , the corresponding patterns A-3 B-1 B-2 are successively outputted to the execution memory 5A from a magnetic disc or other similar device.

As described above, the transfer command of the test pattern generation device of this embodiment is based not on the actual pattern transfer (from a disc to the execution memory) but on a pseudo-transfer process which depends on instructions for the renewal of the data in the modifier register 2A. Therefore, the device does not consume the time required in transferring the actual data of the test patterns as in the conventional pattern generator devices. The device thus enables to output test patterns of several different types at high speeds. The advantage of this design is that the conventional arrangement of the test patterns. such as the one illustrated in FIG. 6, can be used in the device of the present embodiment.

The device having the configuration presented above will also be able to generate patterns which are not divided into sized-groups. The operational steps in such a case will be explained in the following.

It is assumed that the patterns A and B are not divided into groups as shown in FIG. 2 and that the each group is not provided with an index. The leading addresses are designed by A1$a$0, B1$a$0 as before.

Under the action of the control circuit 4A, the leading address A1a0 of the pattern A is stored in the modifier register 2A, and the address generator 1A is activated. Accordingly, the address generator 1A successively outputs addresses $0\sim(2^n-1)$, and these addresses and the n-bit data outputted by the modifier register 2A are added in the adder 3A. The added results are supplied as addresses to the execution memory 5A, through the selector 7A, and pattern A is continuously outputted from the execution memory 5A.

Similarly, by storing the leading address B1a0 of pattern B in the modifier register 2A, the same steps are repeated to output pattern B.

As outlined above, the device of this embodiment enables to store undivided patterns in the memory spaces of n-bit addresses, and to continuously output the patterns. Therefore, pattern generation can be carried out quickly and the development of a large capacity pattern becomes possible.

It should be noted that the above embodiments are illustrative and do not limit the present invention in any way. It is clear that other device configurations and operational sequences can be adopted within the principle of the present invention that it is not necessary to carry out actual transfer of test patterns from a magnetic disc or other permanent storage device to a temporary buffer storage of an appropriate bit length capacity, and that the transfer process can be regulated by specifying the leading addresses and switching the leading addresses from a test pattern to another test pattern.

What is claimed is:

1. A test pattern generation device, for generating test patterns for a semiconductor testing apparatus, comprising:

an execution memory for storing a plurality of test pattern data;

an index address generating means for generating and outputting addresses indicating memory locations of indexes when the indexes are stored in said execution memory;

an address pointer for storing and outputting the addresses outputted by said index address generating means;

an index output means for reading and outputting, from said execution memory, the indexes indicated by the addresses outputted by said address pointer when the indexes are stored in said execution memory, and for generating and outputting the indexes when the indexes are not stored in said execution memory;

a modifier register for storing and outputting the indexes outputted by said index output means;

an address generator for sequentially generating addresses in a designated range;

an adder for adding the addresses generated by said address generator and the indexes outputted from said modifier register, and for outputting memory addresses;

an output means for outputting, from the execution memory, test pattern data indicated by the memory addresses outputted by said adder; and a selector for selecting one of the addresses outputted from said address pointer and said adder, and for supplying said addresses to said execution memory.

2. A test pattern generation device according to claim 1, wherein said index address generating means and said index output means comprise a single control circuit.

3. A test pattern generating device according to claim 1, wherein said execution memory and said output means comprise a single memory device.

* * * * *